(12) United States Patent
Hong et al.

(10) Patent No.: US 10,879,196 B2
(45) Date of Patent: Dec. 29, 2020

(54) THREE-DIMENSIONAL SEMICONDUCTOR MEMORY DEVICES

(71) Applicant: Samsung Electronics Co., Ltd., Suwon-si (KR)

(72) Inventors: Sang Jun Hong, Hwaseong-si (KR); Kyeong Jin Park, Hwaseong-si (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/106,112

(22) Filed: Aug. 21, 2018

(65) Prior Publication Data

US 2019/0267333 A1 Aug. 29, 2019

(30) Foreign Application Priority Data

Feb. 23, 2018 (KR) ........................ 10-2018-0021870

(51) Int. Cl.
*H01L 23/58* (2006.01)
*H01L 27/12* (2006.01)
*H01L 27/115* (2017.01)

(52) U.S. Cl.
CPC .......... *H01L 23/585* (2013.01); *H01L 27/115* (2013.01); *H01L 27/1207* (2013.01)

(58) Field of Classification Search
None
See application file for complete search history.

(56) References Cited

U.S. PATENT DOCUMENTS

| 9,368,216 | B2 | 6/2016 | Tanzawa |
| 9,391,090 | B2 | 7/2016 | Manorotkul et al. |
| 9,455,271 | B1 | 9/2016 | Setta |
| 9,484,354 | B2 | 11/2016 | Lee et al. |
| 9,524,981 | B2 | 12/2016 | Pachamuthu et al. |
| 9,548,316 | B2 | 1/2017 | Lim et al. |
| 9,576,969 | B2 | 2/2017 | Manorotkul et al. |
| 2016/0013148 | A1* | 1/2016 | Lin ................. H01L 23/552 257/773 |
| 2017/0148811 | A1 | 5/2017 | Zhang et al. |
| 2017/0179151 | A1 | 6/2017 | Kai et al. |
| 2018/0342455 | A1* | 11/2018 | Nosho ............... H01L 23/5226 |

FOREIGN PATENT DOCUMENTS

| KR | 10-2016-0023152 | 3/2016 |
| KR | 10-2016-0070245 | 6/2016 |

* cited by examiner

*Primary Examiner* — Nicholas J Tobergte
*Assistant Examiner* — Kien C Ly
(74) *Attorney, Agent, or Firm* — Myers Bigel, P.A.

(57) ABSTRACT

Semiconductor memory devices are provided. A semiconductor memory device includes a cell array region including stacked structures and a word line cut region that extends between the stacked structures. Moreover, the semiconductor memory device includes a peripheral circuit region in a stack with the cell array region and including a support pattern.

18 Claims, 6 Drawing Sheets

THREE-DIMENSIONAL SEMICONDUCTOR MEMORY DEVICES

CROSS-REFERENCE TO RELATED APPLICATION

This U.S. non-provisional patent application claims priority under 35 U.S.C. § 119 to and the benefit of Korean Patent Application No. 10-2018-0021870, filed on Feb. 23, 2018, in the Korean Intellectual Property Office (KIPO), the disclosure of which is hereby incorporated herein by reference in its entirety.

BACKGROUND

The present disclosure relates to vertically stacked semiconductor memory devices. To realize a reduction in weight, width, length, and overall size of electronic devices and increase price competitiveness, it may be desirable to increase the degree of integration of semiconductor memory devices. Recently, to overcome the limit of the degree of integration of two-dimensional semiconductor memory devices, three-dimensional or vertical semiconductor memory devices including memory cells arranged in three dimensions are being developed. A three-dimensional semiconductor memory device includes a plurality of layers which are vertically stacked and a channel structure which passes through the plurality of layers to increase the degree of integration. In the three-dimensional semiconductor memory device, a trench for forming a word line is formed in a cell array region. In the three-dimensional semiconductor memory device, saddle-type warpage may occur during the formation of the trench, which may affect the reliability of the product.

SUMMARY

The present inventive concepts are directed to providing a semiconductor memory device having a high degree of integration and improved reliability.

A semiconductor memory device according to some embodiments of the present inventive concepts includes a cell array region that may include a plurality of stacked structures and a word line cut region that extends in a first direction between the plurality of stacked structures. Moreover, the semiconductor memory device includes a peripheral circuit region that may be in a stack with the cell array region and that may include a support structure that extends across the word line cut region in a second direction crossing the first direction.

A semiconductor memory device according to some embodiments of the present inventive concepts includes a substrate. The semiconductor memory device may include cell array regions including stacked structures, and word line cut regions between the stacked structures, on a first side of the substrate. The semiconductor memory device may include an intermediate connection region between the cell array regions. Moreover, the semiconductor memory device may include a peripheral circuit region on a second side of the substrate opposite the first side. The peripheral circuit region may include a support pattern that may extend to the intermediate connection region.

A semiconductor memory device according to some embodiments of the present inventive concepts includes a substrate. The semiconductor memory device may include first and second cell array regions including stacked structures on the substrate. The semiconductor memory device may include an intermediate connection region between the first and second cell array regions and including an intermediate line cut region that extends in a first direction. Moreover, the semiconductor memory device may include a peripheral circuit region including a support pattern that extends in a second direction perpendicular to the first direction. The substrate may be between the support pattern and the stacked structures.

DETAILED DESCRIPTION

Hereinafter, semiconductor memory devices according to embodiments of the present inventive concepts will be described.

Figure 1:
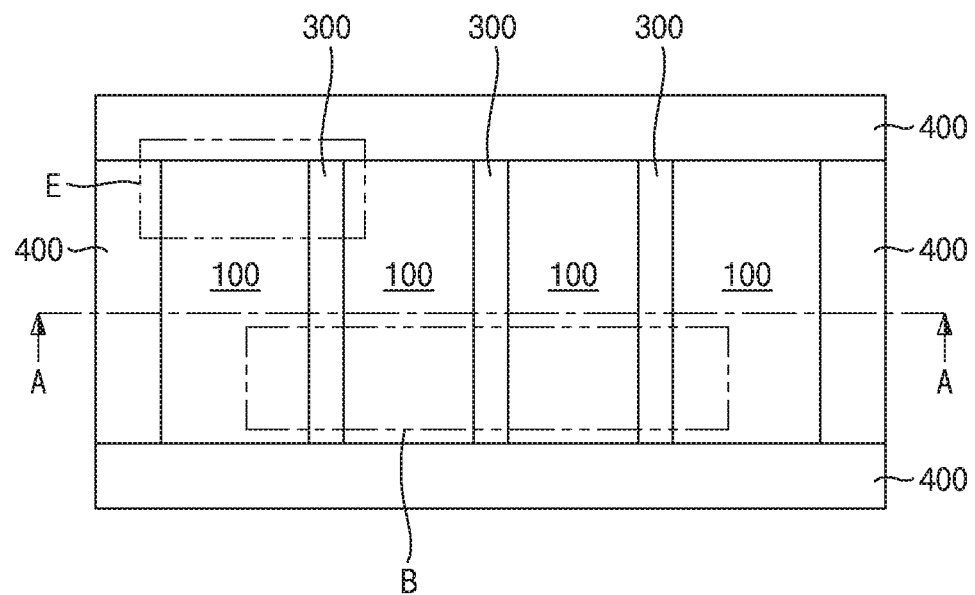
FIG. 1 is a schematic plan view of a semiconductor memory device according to some embodiments of the present inventive concepts.
Figure 2:
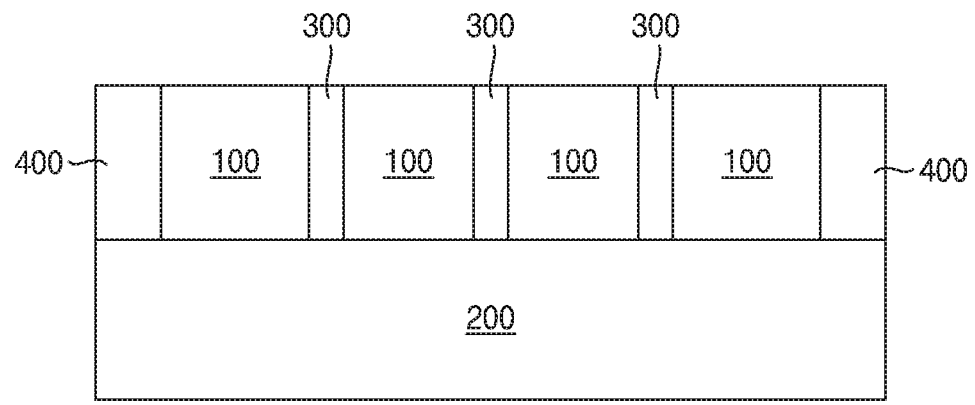
FIG. 2 is a cross-sectional view taken along line A-A of FIG. 1.
Figure 3:
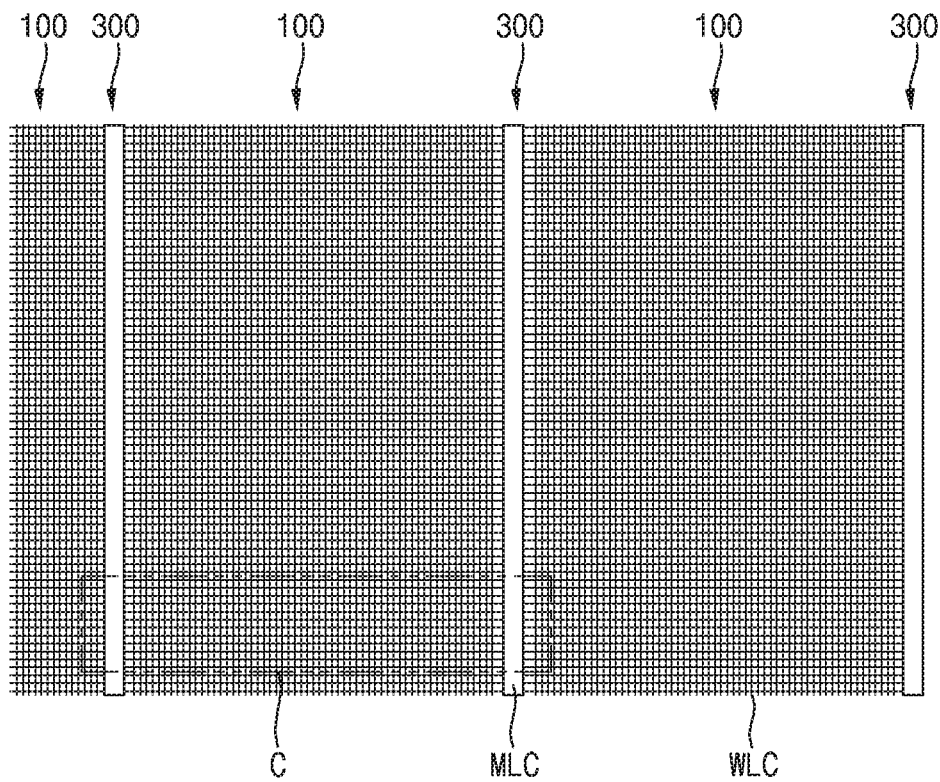
FIG. 3 is a horizontally enlarged view of a portion B of FIG. 1.
Figure 4:
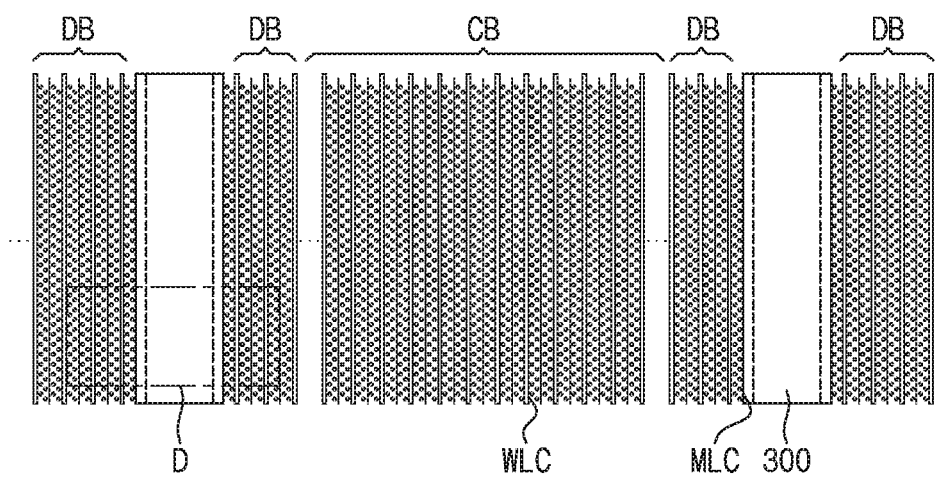
FIG. 4 is an enlarged view of a portion C of FIG. 3 or a portion E of FIG. 1.
Figure 5:
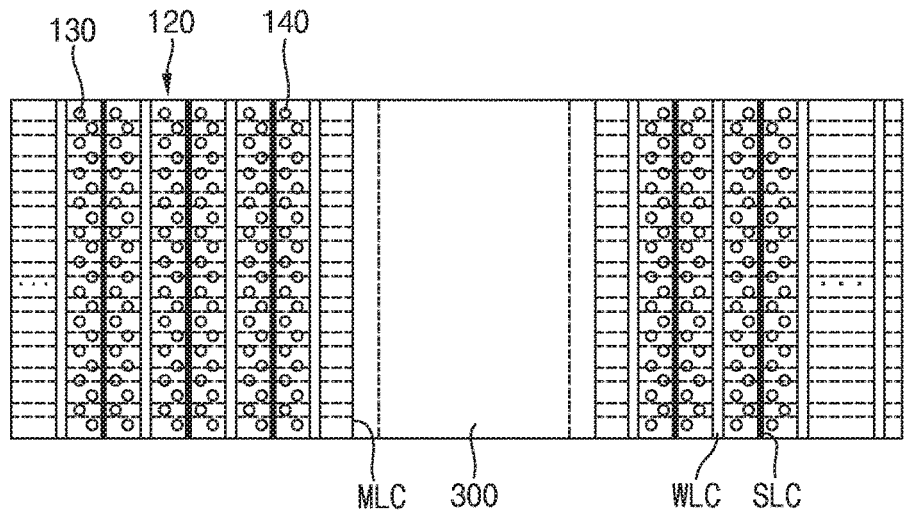
FIG. 5 is a partially enlarged view of a portion D of FIG. 4.
Figure 6:
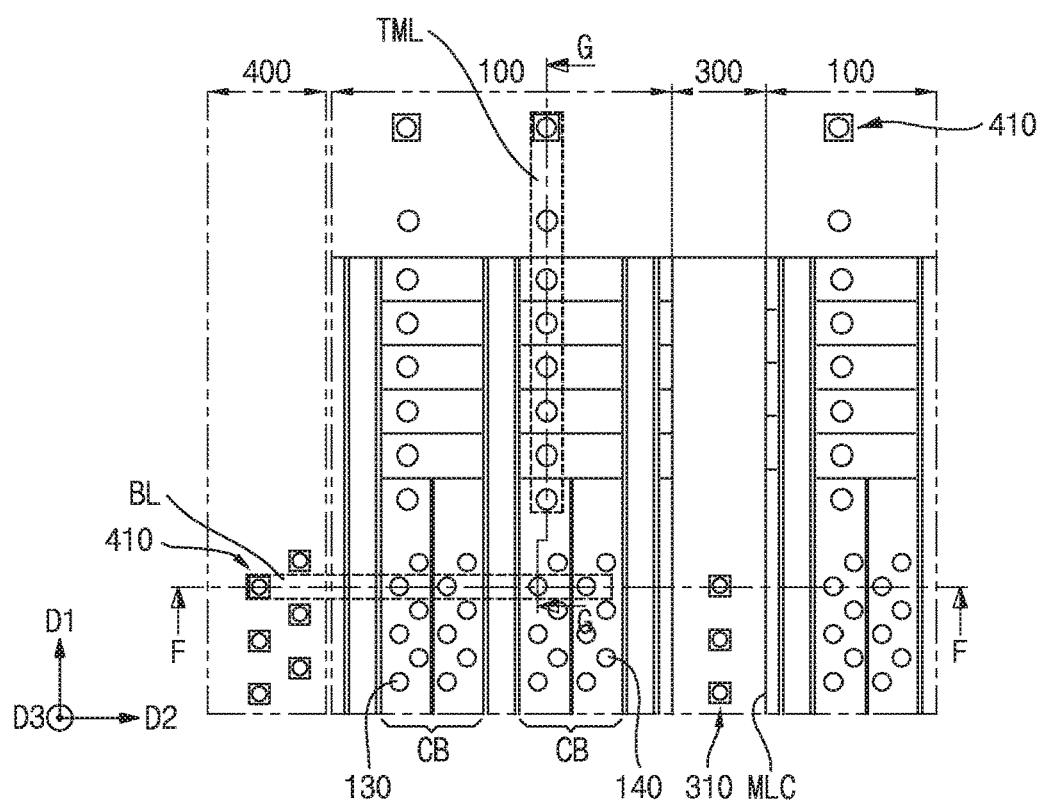
FIG. 6 is a partially enlarged view of the portion E of FIG. 1.
Figure 7:
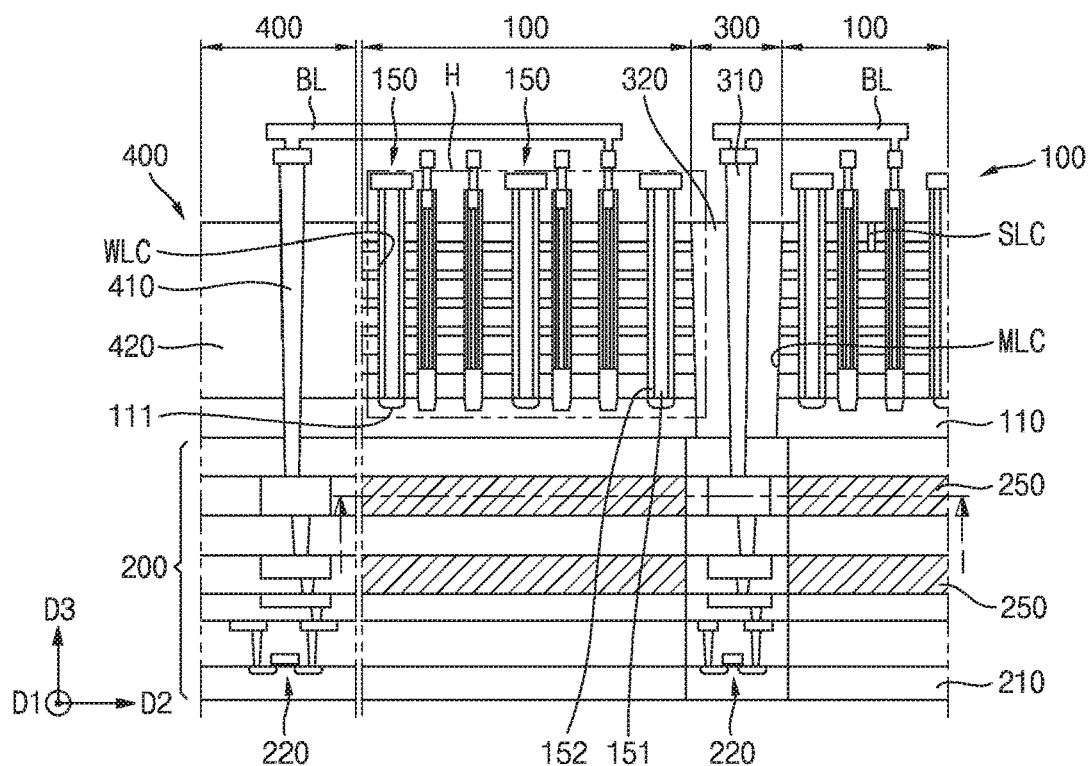
FIG. 7 is a vertical cross-sectional view taken along line F-F of FIG. 6.
Figure 8:
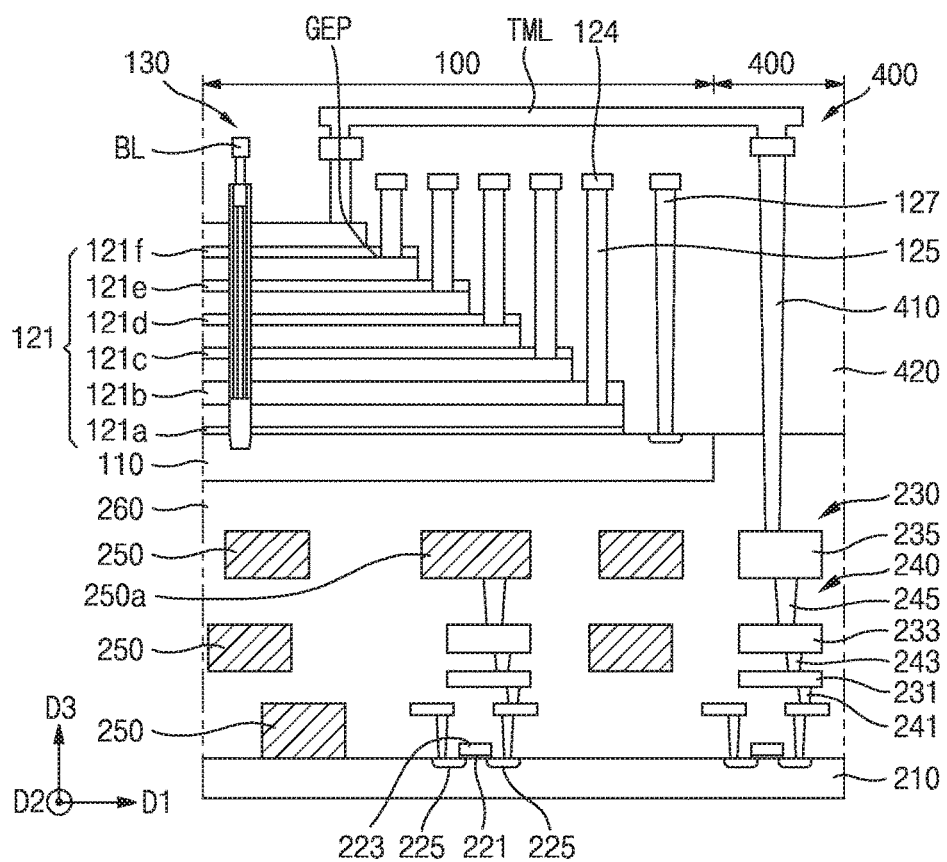
FIG. 8 is a vertical cross-sectional view taken along line G-G of FIG. 6.
Figure 9:
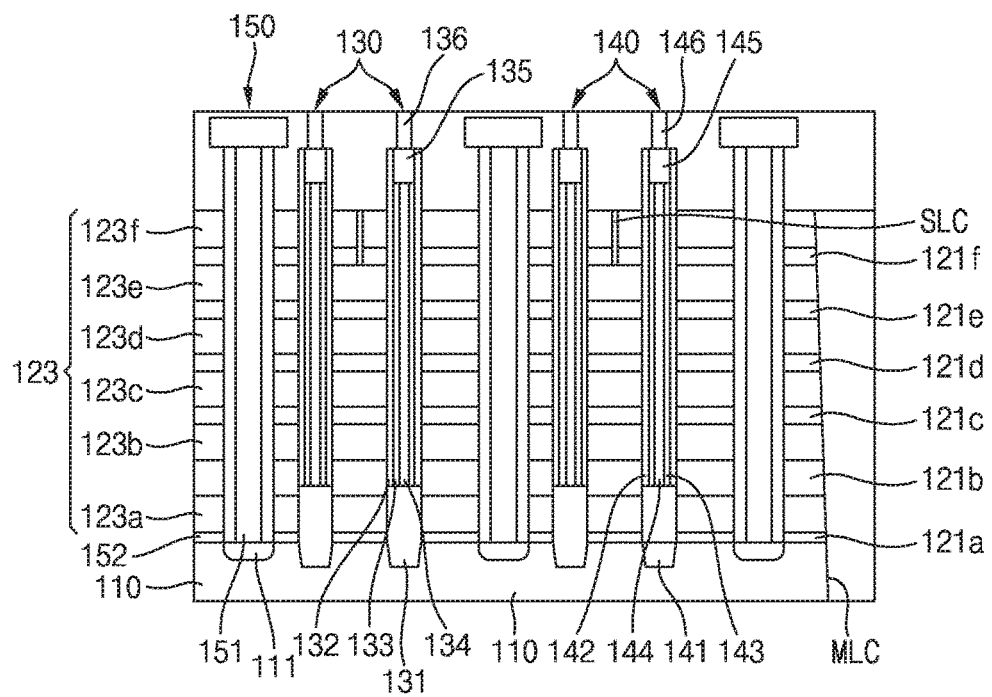
FIG. 9 is an enlarged view of a portion H of FIG. 7.
Figure 10:
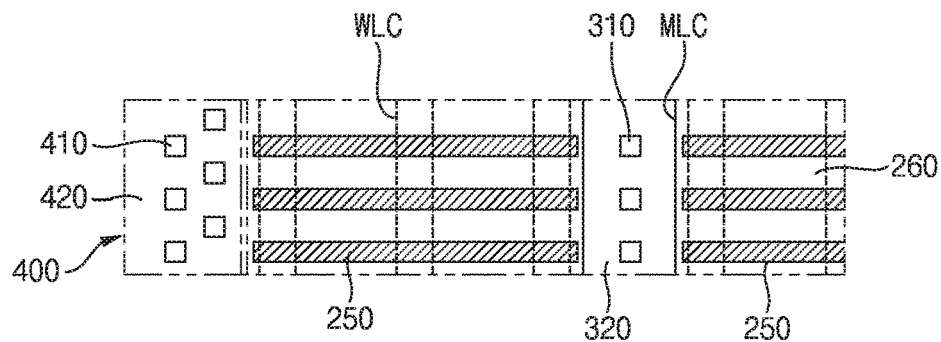
FIG. 10 is a horizontal cross-sectional view taken along line I-I of FIG. 7.

FIG. 1 is a schematic plan view of a semiconductor memory device according to some embodiments of the present inventive concepts. FIG. 2 is a cross-sectional view taken along line A-A of FIG. 1, FIG. 3 is a horizontally enlarged view of a portion B of FIG. 1, FIG. 4 is an enlarged view of a portion C of FIG. 3 or a portion E of FIG. 1, and FIG. 5 is a partially enlarged view of a portion D of FIG. 4. FIG. 6 is a partially enlarged view of a portion E of FIG. 1, FIG. 7 is a vertical cross-sectional view taken along line F-F of FIG. 6, and FIG. 8 is a vertical cross-sectional view taken along line G-G of FIG. 6. FIG. 9 is an enlarged view of a portion H of FIG. 7, and FIG. 10 is a horizontal cross-sectional view taken along line I-I of FIG. 7.

Referring to FIGS. 1 to 10, semiconductor memory devices according to some embodiments of the present inventive concepts may include a cell array region 100, a peripheral circuit region 200, an intermediate connection region 300, and a peripheral connection region 400. Each semiconductor memory device may be a three-dimensional memory device. For example, each semiconductor memory device may be a three-dimensional negative-AND (NAND) flash memory device. As an example, a semiconductor memory device may be formed to have a cell-on-peripheral (COP) structure in which a cell array region 100 is stacked on the peripheral circuit region 200, as shown in FIG. 2. In the semiconductor memory device, the cell array region 100 may overlap at least a portion of the peripheral circuit region 200. The semiconductor memory device may further include bit lines BL and upper metal interconnections TML, as shown in FIG. 6.

Hereinafter, a first direction D1 may refer to a direction in which cell array regions 100 extend, and a second direction D2 may refer to a direction which is perpendicular to the first direction D1 and in which the cell array regions 100 are spaced apart from each other. A third direction D3 may refer to a direction which is perpendicular to the first direction D1 and the second direction D2 and in which the cell array region 100 and the peripheral circuit region 200 are stacked.

Referring to FIGS. 1 and 2 (along with FIG. 6), the plurality of cell array regions 100 may be formed, and the plurality of cell array regions 100 may extend in the first direction D1 and be spaced apart from each other in the second direction D2. The peripheral circuit region 200 may be located below the cell array regions 100. The intermediate connection regions 300 may extend in the first direction D1 and may be located between the cell array regions 100. Each intermediate connection region 300 may be formed in an intermediate line cut region MLC (which may be referred to herein as an "intermediate line cut") formed between the cell array regions 100. The intermediate line cut MLC may be formed by the cell array regions 100 being etched down to the peripheral circuit region 200 in the third direction D3. The peripheral connection region 400 may extend in the first direction D1 or the second direction D2 and may be located outside the outermost cell array region 100.

Referring to FIGS. 6 to 9, the cell array region 100 may include an upper substrate 110, a stacked structure 120, cell channel structures 130, dummy channel structures 140, and common source lines (CSL) 150. The cell array region 100 may include memory cells which are formed by the stacked structure 120 and the cell channel structures 130 and arranged in a three-dimensional array.

The cell array region 100 may include word line cut regions WLC, which may be referred to herein as "word line cuts." Further, the cell array region 100 may include a string selection line cut region SLC, which may be referred to herein as a "string selection line cut."

The cell array region 100 may include a support channel structure which is disposed in a stepped region formed outside the stacked structure 120 and supports the stacked structure 120. In some embodiments, the cell array region 100 may include a molded insulating layer which surrounds and insulates an upper portion of the stacked structure 120, and an upper insulating layer which insulates the bit lines BL at an upper portion of the molded insulating layer.

The cell array region 100 may include cell blocks CB and dummy blocks DB. A cell block CB may include a plurality of cell channel structures 130, and a dummy block DB may include a plurality of dummy channel structures 140. The cell block CB and the dummy block DB may extend in the first direction D1. The cell block CB is located inside the cell array region 100 and the dummy block DB is located outside the cell array region 100 in the second direction D2. The dummy block DB may also be located between the cell blocks CB at the inside of the cell array region 100. The dummy block DB may be located adjacent to the intermediate connection region 300. Here, the cell block CB may refer to a block including memory cells having the cell channel structures 130 in which data is stored. The dummy block DB may refer to a block including memory cells having the dummy channel structures 140 in which data is not stored, and a circuit necessary for storing data may not be formed for the dummy channel structures 140. The dummy block DB may include test logic or related circuits.

At least two word line cuts WLC may be included in each cell array region 100. The word line cuts WLC may extend in the first direction D1 between a cell block CB and another cell block CB, between a cell block CB and a dummy block DB, or between a dummy block DB and another dummy block DB. The word line cuts WLC may be formed by being etched to have a trench shape which has a predetermined width and depth and extends in the first direction D1 in the stacked structure 120. A word line cut WLC may be formed such that a surface of the upper substrate 110 is exposed at an upper portion of the stacked structure 120. The word line cut WLC may be formed to have a predetermined depth from the surface of the upper substrate 110. The CSL 150 may be formed inside the word line cut WLC.

The string selection line cut SLC may extend in the first direction D1 in each cell block CB. The string selection line cut SLC may be formed to have a predetermined depth and width, and may be formed to have a depth passing through a gate electrode located at the uppermost portion of the stacked structure 120. The string selection line cut SLC may extend in the first direction D1 in each cell block CB and separate the cell channel structures 130 in the second direction D2. At least one string selection line cut SLC may be formed according to the number of the cell channel structures 130 formed in the second direction D2 in each cell block CB.

The upper substrate 110 may include a semiconductor material. For example, the upper substrate 110 may be a silicon (Si) single crystalline substrate, a germanium (Ge) single crystalline substrate, or a silicon-germanium (SiGe) single crystalline substrate. The upper substrate 110 may be a P-type semiconductor substrate. The upper substrate 110 may include a P-type impurity such as boron (B), gallium (Ga), or indium (In). The upper substrate 110 is not limited to the P-type semiconductor substrate. The upper substrate 110 may be a silicon-on-insulator (SOI) substrate. The upper substrate 110 may be formed as a semiconductor pattern formed above the peripheral circuit region 200. The upper substrate 110 may include a semiconductor active layer (e.g., a silicon layer, a silicon-germanium layer, or a germanium layer) disposed on an insulating layer which protects transistors provided on a semiconductor substrate. The upper substrate 110 may include a well region.

The upper substrate 110 may include a common source region 111. The common source region 111 may be formed in a region between a cell block CB and another cell block CB and in a region between a cell block CB and a dummy block DB. The common source region 111 may extend in the first direction D1 in the upper substrate 110. The common source region 111 may include a conductive impurity, e.g., an N-type impurity such as arsenic (As) or phosphorus (P) which is different from the upper substrate 110.

The stacked structure 120 may include interlayer insulating layers 121, gate electrodes 123, and gate contacts 125. The stacked structure 120 may be disposed on an upper surface of the upper substrate 110. In some embodiments, a plurality of stacked structures 120 may be disposed on the upper substrate 110. The stacked structure 120 may further include an upper substrate contact 127. The stacked structure 120 may include a plurality of interlayer insulating layers 121, i.e., 121a, 121b, 121c, 121d, 121e, and 121f, and gate electrodes 123, i.e., 123a, 123b, 123c, 123d, 123e, and 123f, which are formed to be alternately stacked in the third direction D3. The stacked structures 120 are formed in the cell array region 100 and extend in the first direction D1 parallel to the surface of the upper substrate 110. The gate electrodes 123 may be insulated from each other by the interlayer insulating layer 121. The stacked structures 120 may be separated from each other for each cell block CB or dummy block DB. The stacked structures 120 may be separated by the CSL 150 located between a cell block CB and another cell block CB or between a cell block CB and a dummy block DB. The stacked structure 120 may have stepped structures at both ends thereof in the first direction D1. More specifically, the gate electrodes 123 may have different extension lengths. A gate electrode 123 may be formed to have a shorter extension length as a position of the gate electrode 123 is higher. The extension length of the lowermost gate electrode 123a among the gate electrodes 123 may be the longest and the extension length of the uppermost gate electrode 123f may be the shortest. A gate electrode 123 may have a gate pad GEP exposed upward in the stepped structure.

An interlayer insulating layer 121 may include an insulating material such as a silicon oxide film, a silicon nitride film, or a silicon oxynitride film. An gate electrode 123 may include a conductive film. For example, the gate electrode 123 may include a semiconductor film (e.g., a silicon film doped with an impurity), a metal silicide film (e.g., a cobalt silicide film, a nickel silicide film, a titanium silicide film, a tungsten silicide film, or a tantalum silicide film), a metal nitride film (e.g., a titanium nitride film, a tungsten nitride film, or a tantalum nitride film), a metal film (e.g., a tungsten film, a nickel film, a cobalt film, a titanium film, a ruthenium film, or a tantalum film), and/or a film formed by combinations thereof. The gate electrode 123 may be used as a control electrode of the memory cells arranged in an array in the cell array region 100. The gate electrode 123 may be coupled to the cell channel structure 130 to form a memory cell. Therefore, a vertical memory cell string including memory cells arranged vertically may be formed in the cell array region 100.

The gate contact 125 is formed to extend upward from an upper surface of the gate pad GEP of each gate electrode 123. The gate contact 125 is electrically connected to the gate pad GEP of the gate electrode 123. A height of the gate contact 125 may be increased as a distance from the cell array region 100 is increased. A gate metal interconnection 124 may be further formed above the gate electrode 123.

The upper substrate contact 127 may extend upward from the upper surface of the upper substrate 110 exposed to the outside of the stacked structure 120. The upper substrate contact 127 may be electrically connected to the upper substrate 110.

The cell channel structure 130 may extend in the third direction D3 and may be in contact with the upper substrate 110 through the stacked structure 120. The plurality of cell channel structures 130 may be arranged in the first direction D1 and the second direction D2 in the cell array region 100 of the cell block CB. The cell channel structures 130 may be arranged in a zigzag shape in the first direction D1 and arranged adjacent to each other in the second direction D2.

The cell channel structures 130 may be formed in various layer structures formed outward with respect to a central axis thereof. For example, the cell channel structure 130 may include a cell information storage pattern 132, a cell channel pattern 133, and a cell buried insulating pattern 134 from outside to inside. The cell channel structure 130 may further include a cell semiconductor pattern 131, a cell conductive pad 135, and a cell bit line contact 136.

The cell semiconductor pattern 131 is located at the lowermost portion of the cell channel structure 130. The cell semiconductor pattern 131 may be in direct contact with and extend into the upper substrate 110. The cell semiconductor pattern 131 may have a circular pillar shape in which a portion thereof is buried in the upper substrate 110 and another portion vertically protrudes from the upper surface of the upper substrate 110. The cell semiconductor pattern 131 is electrically connected to the upper substrate 110. The cell semiconductor pattern 131 may include silicon (Si). The cell semiconductor pattern 131 may be an epitaxial pattern including single crystalline silicon or polycrystalline silicon. The cell semiconductor pattern 131 may include germanium (Ge), silicon germanium (SiGe), a group III-V semiconductor compound, or a group II-VI semiconductor compound. The cell semiconductor pattern 131 may be a pattern undoped with an impurity or a pattern doped with the same impurity as a conductive impurity of the upper substrate 110.

The cell information storage pattern 132 may be disposed on an upper surface of the cell semiconductor pattern 131 and extend in the third direction D3. The cell information storage pattern 132 may be formed to have a hollow pipe shape having open upper and lower ends. The cell information storage pattern 132 may include a thin film for storing data.

The cell channel pattern 133 may be disposed on the upper surface of the cell semiconductor pattern 131 and extend in the third direction D3. The cell channel pattern 133 may be formed to have a hollow pipe shape having open upper and lower ends. The lower end of the cell channel pattern 133 may be in contact and electrically connected with the cell semiconductor pattern 131. An outer circumferential surface of the cell channel pattern 133 may be in contact with an inner circumferential surface of the cell information storage pattern 132. The cell channel pattern 133 may include at least one of silicon (Si), germanium (Ge), silicon germanium (SiGe), gallium arsenide (GaAs), indium gallium arsenide (InGaAs), aluminum gallium arsenide (AlGaAs), and a combination/mixture thereof. The cell channel pattern 133 may include a semiconductor material undoped with an impurity or a semiconductor material doped with the same impurity as a conductive impurity of the upper substrate 110.

The cell buried insulating pattern 134 may be disposed on the upper surface of the cell semiconductor pattern 131 and extend in the third direction D3. The cell buried insulating pattern 134 may be formed in (e.g., to fill) an empty space formed inside the cell channel pattern 133. The cell buried insulating pattern 134 may be formed to have a cylindrical shape. An outer circumferential surface of the cell buried insulating pattern 134 may be in contact with the cell semiconductor pattern 131. The cell buried insulating pattern 134 may be formed of a silicon oxide film or a silicon nitride film.

The cell conductive pad 135 is located above the cell channel pattern 133. The cell conductive pad 135 may be located on the cell buried insulating pattern 134. The cell conductive pad 135 may include a conductive material. In some embodiments, the cell conductive pad 135 may be omitted.

The cell bit line contact 136 is formed to extend upward from an upper surface of the cell conductive pad 135. The cell bit line contact 136 electrically connects the cell conductive pad 135 to the bit line BL. The cell bit line contact 136 may include a conductive material such as doped silicon, a metal silicide, or a metal.

The dummy channel structure 140 may be formed to have the same or similar structure as or to the cell channel structure 130. The dummy channel structure 140 may be formed in the same manner as the cell channel structure 130 except being not electrically connected to the cell bit line contact 136. The dummy channel structure 140 may not form a memory cell. The dummy channel structure 140 may be located outside the cell array region 100 in the second direction D2, and thus the dummy channel structure 140 may not operate normally even when a memory cell is formed under an environment different from that of the cell channel structure 130 located inside the cell array region 100. Meanwhile, the dummy channel structure 140 may be formed such that a lower portion thereof is electrically insulated from the upper substrate 110. For example, the dummy channel structure 140 may be formed such that the lower portion thereof is insulated from the upper substrate 110 by a device isolation film.

The dummy channel structure 140 may include a dummy information storage pattern 142, a dummy channel pattern 143, and a dummy buried insulating pattern 144. The dummy channel structure 140 may further include a dummy semiconductor pattern 141, a dummy conductive pad 145, and a dummy bit line contact 146. A further detailed description of the dummy channel structure 140 will be omitted.

The CSL 150 includes a common source plug 151 and a common source spacer 152. The CSL 150 is located between the cell blocks CB, between a cell block CB and a dummy block DB, or between the dummy blocks DB. The CSL 150 may be located inside the word line cut WLC. The word line cut WLC may be formed by the stacked structure 120 being etched in the first direction D1. More specifically, the word line cut WLC may be formed to have a trench shape which extends in the first direction D1 through the stacked structure 120. A word line may be formed in the word line cut WLC and may overlap one or more support structures, which may be referred to herein as "support patterns" 250 (FIG. 7). The word line cut WLC may be formed by being etched down to the upper surface of the upper substrate 110. The word line cut WLC may be formed by the upper surface of the upper substrate 110 being etched in a predetermined depth. The CSL 150 may extend to the common source region 111 of the upper substrate 110 and be electrically connected to the common source region 111.

The common source plug 151 may extend in the first direction D1 along the common source region 111 inside the word line cut WLC. The common source plug 151 may extend from the common source region 111 to the upper portion of the stacked structure 120. The common source plug 151 may be formed to have a wall structure. The common source plug 151 may be formed to have a bar shape which extends in the first direction D1 when viewed from above. The common source plug 151 may include a conductive material such as tungsten, copper, titanium, titanium nitride, tantalum, tantalum nitride, silicon, or aluminum.

The common source spacer 152 is formed between an inner side surface of the word line cut WLC and the common source plug 151. The common source spacer 152 may be in (e.g., may fill) a space between the common source plug 151 and the stacked structure 120. The common source spacer 152 may be on (e.g., may cover) sidewalls of the stacked structure 120. The common source spacer 152 electrically insulates the common source plug 151 from the gate electrode 123 of the stacked structure 120. The common source spacer 152 may include silicon oxide, silicon nitride, silicon oxynitride, or a low dielectric material.

The intermediate line cut MLC may be formed by the stacked structure 120 and the upper substrate 110 of the cell array region 100 being etched in the first direction D1. The intermediate line cut MLC may extend in the first direction D1 between the cell array regions 100. The intermediate line cut MLC may be etched from the upper portion of the stacked structure 120 to a lower portion of the upper substrate 110. The intermediate line cut MLC may expose an upper surface of a peripheral circuit insulating layer 260 in the peripheral circuit region 200. At least one intermediate line cut MLC may be formed according to the number of the cell array regions 100. A plurality of intermediate line cuts MLC may be formed.

The bit line BL may extend in the second direction D2 at upper portions of the cell array region 100 and the intermediate connection region 300 or at an upper portion of the peripheral circuit region 200. The bit line BL may be in contact with an upper portion of the cell bit line contact 136 of the cell channel structure 130 and be electrically connected to the cell channel structure 130. The bit line BL is not electrically connected to the dummy channel structure 140. The bit line BL may include a conductive metal such as aluminum, copper, or tungsten.

The upper metal interconnection TML may extend in the first direction D1 at the upper portions of the cell array region 100 and the peripheral connection region 400. The upper metal interconnection TML may be in contact with an upper portion of the gate contact 125 and be electrically connected to the gate electrode 123. The upper metal interconnection TML may include a conductive metal such as tungsten. The peripheral circuit region 200 may include a lower substrate 210, a plurality of peripheral transistors 220, a peripheral circuit interconnection 230, a peripheral circuit contact 240, support patterns 250, and a peripheral circuit insulating layer 260. The peripheral transistors 220 and the peripheral circuit interconnection 230 may constitute a peripheral circuit. The peripheral circuit region 200 may be located below cell array region 100. At least a portion of the peripheral circuit region 200 may underlap the entire region of the cell array region 100.

The lower substrate 210 may include a semiconductor substrate such as a silicon wafer. The lower substrate 210 may be formed of the same material as that of the upper substrate 110. The lower substrate 210 may be formed to have a greater area than the upper substrate 110, and the entire upper substrate 110 may overlap at least a portion of the lower substrate 210. In some embodiments, the lower substrate 210 may include a device isolation film formed between the peripheral transistors 220 to electrically insulate the peripheral transistors 220.

A peripheral transistor 220 may include a peripheral gate insulating film 221, a peripheral gate electrode 223, and a source/drain region 225. The peripheral transistor 220 may further include peripheral gate spacers. The peripheral gate electrode 223 is disposed above the peripheral gate insulating film 221. The peripheral gate electrode 223 may include silicon, a metal silicide such as nickel silicide, cobalt silicide, titanium silicide, or tantalum silicide (TaSi), or a metal. The peripheral gate spacers may be disposed on sidewalls of the peripheral gate electrode 223. The source/drain region 225 may be disposed in the lower substrate 210, and may include an N-type impurity (e.g., phosphorus (P)) or a P-type impurity (e.g., boron (B)). A plurality of peripheral transistors 220 may be formed in the peripheral circuit region 200, and a peripheral transistor 220 may include a high- or low-voltage transistor.

The peripheral circuit interconnections 230 may include a metal interconnection which is deposited on the lower substrate 210. The peripheral circuit interconnections 230 may be formed to have a line shape or a pad shape which extends in the first direction D1 or the second direction D2. The peripheral circuit interconnections 230 may be formed at various positions according to a position of the peripheral transistor 220. The peripheral circuit interconnections 230 may include a lower metal interconnection 231, an intermediate metal interconnection 233, and an upper metal interconnection 235 which are sequentially deposited on the lower substrate 210. The peripheral circuit interconnections 230 may be divided into more or fewer layers according to the structure of the peripheral circuit region 200.

The peripheral circuit contact 240 may include a metal contact deposited on the lower substrate 210. The peripheral circuit contact 240 may be formed to have a via shape which extends in the third direction D3. The peripheral circuit contact 240 may include a lower metal contact 241, an intermediate metal contact 243, and an upper metal contact 245 which are sequentially deposited on the lower substrate 210. The lower metal contact 241 may be in contact with the peripheral transistor 220 and the lower metal interconnection 231 to electrically connect the peripheral transistor 220 to the lower metal interconnection 231. The intermediate metal contact 243 may be in contact with the lower metal interconnection 231 and the intermediate metal interconnection 233 to electrically connect the lower metal interconnection 231 to the intermediate metal interconnection 233. The upper metal contact 245 may be in contact with the intermediate metal interconnection 233 and the upper metal interconnection 235 to electrically connect the intermediate metal interconnection 233 to the upper metal interconnection 235. The peripheral circuit contact 240 may be formed to have various shapes at various positions according to the position of the peripheral transistor 220.

Support patterns 250 may be formed with a metal layer deposited on the lower substrate 210. The support patterns 250 may be located below the cell array region 100. In some embodiments, one or more of the support patterns 250 may be formed to have a straight line shape. For example, all of the support patterns 250 may be formed to have a straight line shape. The support patterns 250 may be disposed in a direction crossing the first direction D1. The support patterns 250 may extend in the second direction D2. The support patterns 250 may be formed to extend continuously to cross/underlap at least two word line cuts WLC. For example, the support patterns 250 may be formed to have a length in the second direction D2 which crosses/underlaps at least two word line cuts WLC. The support patterns 250 may vertically cross/underlap the word line cuts WLC, such that vertical axes extend in the third direction D3 through the support patterns 250 and through the word line cuts WLC. Two or more of the support patterns 250 may have respective side surfaces that are aligned/coplanar in the third direction D3 perpendicular to the first direction D1 and the second direction D2. Accordingly, the support patterns 250 may be arranged such that at least some of the support patterns 250 are aligned/coplanar in the third direction D3. For example, the support patterns 250 may be formed such that all of the support patterns 250 are aligned/coplanar in the third direction D3. In particular, all of the support patterns 250 may have respective side surfaces that are vertically aligned/coplanar in the third direction D3. Moreover, a support pattern 250 may include a plurality of coplanar portions (e.g., uppermost surfaces at the same vertical level in the third direction D3) that are spaced apart from each other in the first direction D1. When the cell array region 100 includes the plurality of word line cuts WLC, the support patterns 250 may cross the plurality of word line cuts WLC and extend in the second direction D2.

A support pattern 250 may, in some embodiments, be formed to have a length in the second direction D2 corresponding to a length of the cell array region 100 in the second direction D2. In some embodiments, the support pattern 250 may be formed to have a length in the second direction D2 longer than the length of the cell array region 100 in the second direction D2. The support pattern 250 may be in contact with an outer surface of the intermediate connection region 300 in the second direction D2. The support pattern 250 may be disposed to extend from a cell array region 100 located at one side of the intermediate connection region 300 to another cell array region 100 located at the other side of the intermediate connection region 300. The support pattern 250 may connect two adjacent intermediate line cuts MLC in the second direction D2.

A support pattern 250 may be formed to have a quadrilateral shape such as a bar shape or a band shape. The support pattern 250 may be formed to have a shape in which a cross section in a direction perpendicular to the second direction D2 has a predetermined width and thickness. The support pattern 250 may be formed of a metal material. For example, the support pattern 250 may be formed of a metal material such as tungsten (W), copper (Cu), or nickel (Ni).

A support pattern 250 may be formed by being deposited on the lower substrate 210. The support pattern 250 may be formed along with the peripheral circuit interconnection 230.

For example, the support pattern 250 may be formed by the same process as that of the peripheral circuit interconnections 230. As an example, the support pattern 250 may be disposed at the same vertical level as that of an adjacent peripheral circuit interconnection 230 in the third direction D3. Further, the support pattern 250 may be formed to have the same vertical thickness in the third direction D3 as that of the peripheral circuit interconnection 230. The peripheral circuit interconnections 230 may be arranged as a plurality of layers in the third direction D3, and the support patterns 250 may also be formed as a plurality of layers. Each support pattern 250 may include a lower reinforcement layer, an intermediate reinforcement layer, and an upper reinforcement layer which are sequentially deposited on the lower substrate 210. The support patterns 250 may be divided into more or fewer layers in a vertical direction according to the structure of the peripheral circuit region 200. Further, one or more of the support patterns 250 may be formed at a level at which a peripheral circuit interconnection 230 is not formed.

The support pattern 250 may be formed in a direction crossing the word line cut WLC to act to reinforce the strength of the semiconductor memory device in the second direction D2. The support pattern 250 may inhibit/prevent saddle-type warpage occurring in the process of forming the word line cut WLC. For example, each of the support patterns 250 may be formed to cross at least two word line cuts WLC, and thus the saddle-type warpage may be effectively reduced. Moreover, in some embodiments, all of the support patterns 250 may have respective side surfaces that are vertically aligned/coplanar, which may result in the saddle-type warpage being more effectively/efficiently reduced.

A support pattern 250 may be formed such that at least a portion thereof is electrically insulated from the peripheral transistor 220, the peripheral circuit interconnection 230, and the peripheral circuit contact 240. Further, referring to FIG. 8, a support pattern 250*a* may be formed to be electrically connected to the peripheral transistor 220, the peripheral circuit interconnection 230, or the peripheral circuit contact 240. In some embodiments, the peripheral transistor 220 may be electrically connected to the peripheral circuit contact 240. The support patterns 250 may be formed in direct contact with the peripheral circuit interconnection 230 or the peripheral circuit contact 240. In some embodiments, at least a portion of the support pattern 250*a* may act as a circuit interconnection which electrically connects ones of the peripheral transistors 220, or ones of the peripheral circuit contacts 240, that are spaced apart from each other.

Figure 11:
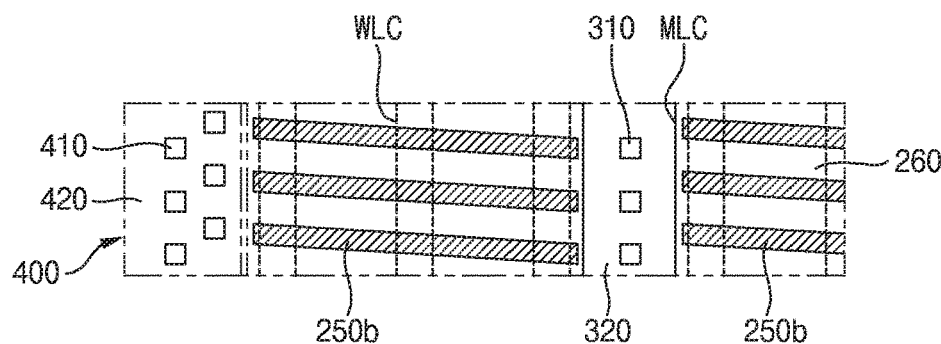
FIG. 11 is a horizontal cross-sectional view corresponding to FIG. 10 according to some embodiments of the present inventive concepts.

According to some embodiments of the present inventive concepts, referring to FIG. 11, a support pattern 250*b* may extend in a direction crossing the cell intermediate line cut MLC. The support pattern 250*b* may extend in a direction inclined from the second direction D2 perpendicular to the first direction D1. More specifically, the support pattern 250*b* may be formed to be inclined from the second direction D2 toward the first direction D1 at a predetermined angle. Accordingly, the support pattern 250*b* may extend in a direction that is oblique to the first direction D1. In some embodiments, at least a portion of the support pattern 250*b* may extend in a direction parallel to the second direction D2 and the remaining portion of the support pattern 250*b* may extend in a direction inclined from the second direction D2.

Figure 12:
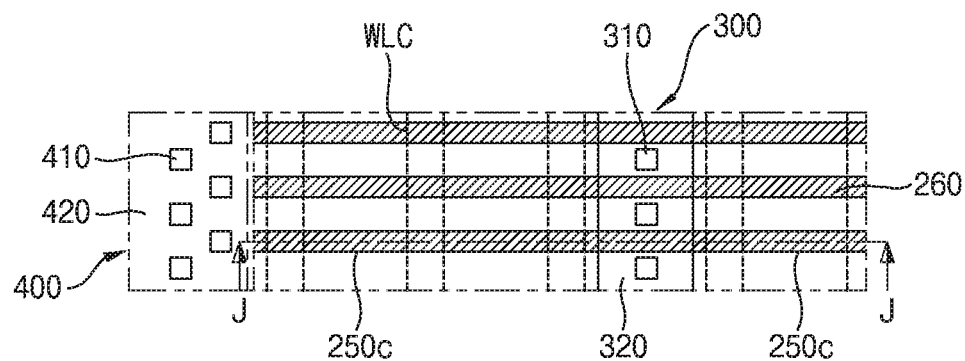
FIG. 12 is a horizontal cross-sectional view corresponding to FIG. 10 according to some embodiments of the present inventive concepts.
Figure 13:
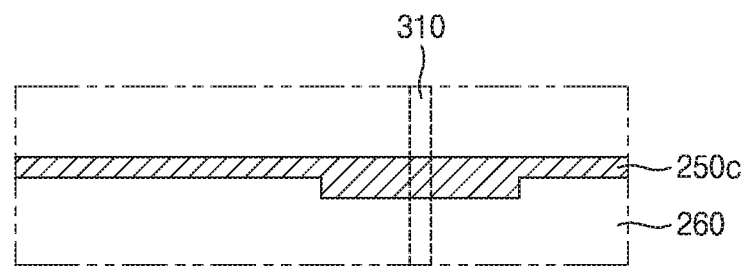
FIG. 13 is a vertical cross-sectional view taken along line J-J of FIG. 12.

According to some embodiments of the present inventive concepts, referring to FIGS. 12 and 13, a support pattern 250*c* may be formed in a direction crossing the intermediate line cut MLC at lower portions of the cell array region 100 and the intermediate connection region 300. The support pattern 250*c* may extend in the second direction D2 perpendicular to the first direction D1. The support pattern 250*c* may extend in a direction perpendicular to the intermediate line cut MLC. The support pattern 250*c* may extend in the intermediate connection region 300 located between the cell array regions 100 and may also be formed below the intermediate connection region 300. The support pattern 250*c* may extend from the cell array region 100 located at one side of the intermediate connection region 300 to another cell array region 100 located at the other side of the intermediate connection region 300. In some embodiments, the support pattern 250*c* may be formed to cross at least two intermediate line cuts MLC.

A portion of the support pattern 250*c* located below the intermediate connection region 300 may have a relatively greater cross-sectional area of the pattern in a direction perpendicular to the second direction D2 than a portion of the support pattern 250*c* located below the cell array region 100. For example, a region of the support pattern 250*c* located below the intermediate connection region 300 may have a relatively greater thickness than a region of the support pattern 250*c* located below the cell array region 100. The region of the support pattern 250*c* located below the intermediate connection region 300 may have a relatively greater width than the region of the support pattern 250*c* located below the cell array region 100. The word line cut WLC may be formed up to the upper surface of the upper substrate 110, and the intermediate line cut MLC may be formed to pass through a lower surface of the upper substrate 110. Further, the intermediate line cut MLC may have a relatively greater width than the word line cut WLC. Therefore, the intermediate line cut MLC may affect the generation of saddle-type warpage more than the word line cut WLC. The support pattern 250*c* may be formed to be relatively thick at a position corresponding to the intermediate connection region 300, and thus the saddle-type warpage may be more effectively/efficiently reduced.

Figure 14:
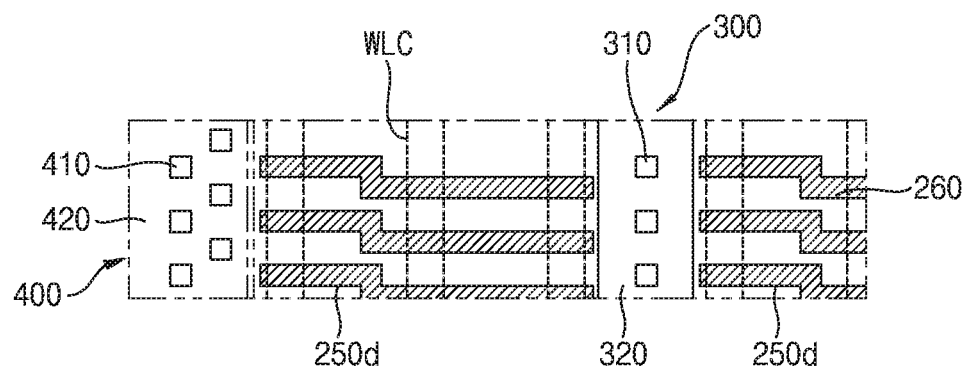
FIG. 14 is a horizontal cross-sectional view corresponding to FIG. 10 according to some embodiments of the present inventive concepts.

According to some embodiments, referring to FIG. 14, a support pattern 250*d* may include a portion which extends in the second direction D2 and is partially bent in the first direction D1. Further, in some embodiments, the support pattern 250*d* may include a portion which is bent in the third direction D3 perpendicular to the first direction D1 and the second direction D2. Accordingly, the support pattern 250*d* may include a bent line shape that changes direction to extend in the first direction D1 or the third direction D3. The peripheral circuit region 200 may be formed by the peripheral transistor 220 and the peripheral circuit interconnection 230 or the peripheral circuit contact 240 being disposed therein. In the peripheral circuit region 200, the peripheral transistor 220 and the peripheral circuit interconnection 230 or the peripheral circuit contact 240 may be located on a line in which the support pattern 250*d* extends. In some embodiments, the support pattern 250*d* may be formed to be bent in the first direction D1 or the third direction D3 and formed not to be in contact with the peripheral transistor 220, the peripheral circuit interconnection 230, or the peripheral circuit contact 240. The support pattern 250*d* may be formed to have a desired/required length (e.g., an increased length) without disconnection in the middle thereof. Therefore, the saddle-type warpage may be more effectively/efficiently reduced due to the support pattern 250*d*.

The peripheral circuit insulating layer 260 may be formed above the lower substrate 210 to be on (e.g., to cover) the peripheral transistor 220, the peripheral circuit interconnection 230, the peripheral circuit contact 240, and the support patterns 250. The peripheral circuit insulating layer 260 may be formed by being deposited between the lower substrate 210 and the upper substrate 110. The peripheral circuit insulating layer 260 may be formed as a plurality of interlayer insulating layers 121. The peripheral circuit insulating layer 260 may be formed as a number of layers corresponding to the number of layers of the peripheral circuit interconnection 230. The peripheral circuit insulating layer 260 may be divided into a peripheral lower insulating layer, a peripheral intermediate insulating layer, and a peripheral upper insulating layer which are sequentially deposited on the lower substrate 210. The peripheral circuit insulating layer 260 may be divided into more or fewer layers according to the number of the layers of the support patterns 250. The peripheral circuit insulating layer 260 may be formed of a silicon oxide film or a low dielectric material.

The intermediate connection region 300 may include intermediate connection contacts 310 and an intermediate connection insulating layer 320. The intermediate connection region 300 may be formed by the stacked structure 120 and the upper substrate 110 being etched in the first direction D1. More specifically, the intermediate connection region 300 may be formed inside the intermediate line cut MLC in which the stacked structure 120 and the upper substrate 110 of the cell array region 100 are etched in the first direction D1. The intermediate line cut MLC may extend in the first direction D1 between the cell array regions 100. The intermediate connection region 300 may be located above the peripheral circuit region 200. The intermediate line cut MLC may be formed by being etched from an upper portion of the stacked structure 120 to the lower surface of the upper substrate 110. The intermediate line cut MLC may be formed to penetrate or pass through the upper substrate 110. The intermediate line cut MLC may expose an upper surface of the peripheral circuit insulating layer 260 in the peripheral circuit region 200.

The intermediate connection contact 310 may extend in the third direction D3 at the inside of the intermediate line cut MLC. A plurality of intermediate connection contacts 310 may be located at the inside of the intermediate line cut MLC to be spaced apart from each other in the first direction D1. A lower portion of the intermediate connection contact 310 may be in contact with the peripheral circuit interconnection 230 in the peripheral circuit region 200 to be electrically connected. An upper portion of the intermediate connection contact 310 may be in contact with the bit line BL to be electrically connected. The intermediate connection contact 310 may electrically connect the cell channel structure 130 to the peripheral circuit. The intermediate connection contacts 310 may be formed in an arrangement and number corresponding to an arrangement and the number of the cell channel structures 130 and the peripheral circuit interconnections 230. Meanwhile, the intermediate connection contact 310 may electrically connect the gate electrode 123 in the cell array region 100 to the peripheral circuit in the peripheral circuit region 200. The intermediate connection contact 310 may include a conductive material such as silicon or tungsten.

The intermediate connection insulating layer 320 may be formed at the upper portion of the peripheral circuit region 200 in (e.g., to fill) the inside of the intermediate line cut MLC. The intermediate connection insulating layer 320 may surround side portions of the intermediate connection contacts 310 to electrically insulate the intermediate connection contacts 310 from each other. The intermediate connection insulating layer 320 may expose the upper portion of the intermediate connection contact 310. The intermediate connection insulating layer 320 may be formed of a silicon oxide film or a low dielectric material.

The peripheral connection region 400 may include peripheral connection contacts 410 and a peripheral connection insulating layer 420. The peripheral connection region 400 may extend in the first direction D1 at the outside of the cell array region 100 located most outward in the second direction D2. Further, the peripheral connection region 400 may be located in front of and behind the cell array region 100 in the first direction D1. In this case, the peripheral connection region 400 may extend in the second direction D2. The peripheral connection region 400 may be located above the peripheral circuit region 200.

The peripheral connection contact 410 may extend in the third direction D3 in the peripheral connection region 400. A plurality of peripheral connection contacts 410 may be located in the peripheral connection region 400 to be spaced apart from each other in the first direction D1. A lower portion of the peripheral connection contact 410 may be in contact with the peripheral circuit interconnection 230 in the peripheral circuit region 200 to be electrically connected. An upper portion of the peripheral connection contact 410 may be electrically connected to the bit line BL to electrically connect the cell channel structure 130 in the cell array region 100 to the peripheral circuit in the peripheral circuit region 200. Alternatively, the peripheral connection contact 410 may be electrically connected to the upper metal interconnection TML to electrically connect the gate electrode 123 in the cell array region 100 to the peripheral circuit in the peripheral circuit region 200. The peripheral connection contact 410 may be formed at a position corresponding to the peripheral circuit interconnection 230. The peripheral connection contact 410 may include a conductive material such as silicon or tungsten.

The peripheral connection insulating layer 420 may be formed above the peripheral circuit region 200 to surround the peripheral connection contacts 410. The peripheral connection insulating layer 420 may be formed to have a predetermined height above the peripheral circuit insulating layer 260. The peripheral connection insulating layer 420 may be formed of a silicon oxide film or a low dielectric material.

According to example embodiments of the present inventive concepts, a semiconductor memory device, in which saddle-type warpage is reduced and the degree of integration and reliability are improved by forming support patterns in a direction crossing a word line in a peripheral circuit region located below a cell array region, can be implemented.

Although example embodiments of the present inventive concepts have been described with reference to the accompanying drawings, it will be understood by those skilled in the art that various modifications may be made without departing from the scope of the present inventive concepts as set forth by the following claims. Therefore, the above-described embodiments should be considered in a descriptive sense only and not for purposes of limitation.

What is claimed is:

1. A semiconductor memory device comprising:
 a cell array region comprising a plurality of stacked structures and a word line cut region that extends in a first direction between the plurality of stacked structures; and
 a peripheral circuit region in a stack with the cell array region and comprising a metal support structure that extends across the word line cut region in a second direction crossing the first direction,
 wherein the word line cut region comprises one among at least two word line cut regions that extend in the first direction between the plurality of stacked structures, and
 wherein the metal support structure extends continuously across each of the at least two word line cut regions.

2. The semiconductor memory device of claim 1, wherein the at least two word line cut regions comprise three word line cut regions.

3. The semiconductor memory device of claim 1, further comprising:
 a word line in the word line cut region,
  wherein the word line overlaps the metal support structure, and
  wherein the metal support structure comprises a first length in the second direction that is at least as long as a second length of the cell array region in the second direction; and
 a bit line that extends in the second direction over a majority of the second length of the cell array region.

4. The semiconductor memory device of claim 1, wherein the metal support structure comprises:
 a first layer comprising a first side surface and an opposite second side surface; and
 a second layer comprising third and fourth side surfaces that are aligned with the first and second side surfaces, respectively, in a third direction perpendicular to the first direction.

5. The semiconductor memory device of claim 1, wherein:

the peripheral circuit region further comprises a peripheral transistor, a peripheral circuit contact electrically connected to the peripheral transistor, and a peripheral circuit interconnection electrically connected to the peripheral circuit contact; and the metal support structure comprises a portion that is at the same level as a portion of the peripheral circuit interconnection.

6. The semiconductor memory device of claim 5, wherein:
the peripheral circuit interconnection comprises first and second layers stacked in a third direction perpendicular to the first direction; and
the metal support structure comprises:
a first layer comprising an uppermost surface that is coplanar with an uppermost surface of the first layer of the peripheral circuit interconnection; and
a second layer comprising an uppermost surface that is coplanar with an uppermost surface of the second layer of the peripheral circuit interconnection.

7. The semiconductor memory device of claim 5, further comprising an insulating layer on the metal support structure,
wherein the metal support structure is electrically insulated from the peripheral circuit contact or the peripheral circuit interconnection by the insulating layer.

8. The semiconductor memory device of claim 5, wherein the metal support structure is electrically connected to the peripheral circuit contact or the peripheral circuit interconnection.

9. The semiconductor memory device of claim 1,
wherein the second direction in which the metal support structure extends is perpendicular to the first direction or is oblique to the first direction, and
wherein the first and second directions are respective horizontal directions.

10. The semiconductor memory device of claim 1, wherein the metal support structure comprises a bent line shape that changes direction to extend in the first direction or in a third direction perpendicular to the first direction and the second direction.

11. The semiconductor memory device of claim 1, wherein:
the peripheral circuit region comprises a plurality of peripheral transistors and a plurality of peripheral circuit contacts electrically connected to the plurality of peripheral transistors, respectively; and
the metal support structure comprises a circuit interconnection that electrically connects spaced-apart ones of the plurality of peripheral circuit contacts, or spaced-apart ones of the plurality of peripheral transistors, to each other.

12. A semiconductor memory device comprising:
a substrate;
cell array regions comprising stacked structures, and word line cut regions between the stacked structures, on a first side of the substrate;
an intermediate connection region between the cell array regions, wherein the intermediate connection region is wider than each of the word line cut regions; and
a peripheral circuit region on a second side of the substrate opposite the first side, the peripheral circuit region comprising a metal support pattern extending to the intermediate connection region,
wherein the metal support pattern comprises:
a first portion having a first thickness that is overlapped by the word line cut regions; and
a second portion having a second thickness that is overlapped by the intermediate connection region and is thicker than the first thickness.

13. The semiconductor memory device of claim 12, wherein the metal support pattern continuously extends across at least two of the word line cut regions.

14. The semiconductor memory device of claim 12, wherein:
the substrate comprises a first substrate;
the semiconductor memory device further comprises a second substrate;
the peripheral circuit region comprises a peripheral transistor on the second substrate, a peripheral circuit contact electrically connected to the peripheral transistor, and a peripheral circuit interconnection electrically connected to the peripheral circuit contact; and
the metal support pattern comprises a portion at the same level as a portion of the peripheral circuit interconnection.

15. The semiconductor memory device of claim 14, wherein:
the peripheral circuit interconnection comprises a first layer and a second layer that is stacked on the first layer; and
the metal support pattern comprises:
a first layer comprising an uppermost surface that is coplanar with an uppermost surface of the first layer of the peripheral circuit interconnection; and
a second layer comprising an uppermost surface that is coplanar with an uppermost surface of the second layer of the peripheral circuit interconnection.

16. A semiconductor memory device comprising:
a substrate;
first and second cell array regions comprising stacked structures on the substrate, wherein the first and second cell array regions comprise first word line cut regions and second word line cut regions, respectively, that extend in a first direction between the stacked structures;
an intermediate connection region between the first and second cell array regions and comprising an intermediate line cut region that extends in the first direction, wherein the intermediate connection region comprises an insulating layer and a contact that penetrate or pass through the substrate and the stacked structures; and
a peripheral circuit region comprising a support pattern that extends in a second direction perpendicular to the first direction, wherein the substrate is between the support pattern and the stacked structures,
wherein the support pattern comprises a first support line that crosses at least two of the first word line cut regions or at least two of the second word line cut regions, and
wherein the support pattern further comprises a second support line that is laterally spaced apart from the first support line in the first direction and that crosses the at least two of the first word line cut regions or the at least two of the second word line cut regions.

17. The semiconductor memory device of claim 16, wherein the support pattern is metal and extends continuously from the first cell array region at a first side of the intermediate connection region to the second cell array region at a second side of the intermediate connection region.

18. The semiconductor memory device of claim 17, wherein a first portion of the support pattern that is overlapped by the intermediate connection region is thicker than a second portion of the support pattern that is overlapped by the first cell array region or the second cell array region.

\* \* \* \* \*